(12) United States Patent
Hirano

(10) Patent No.: US 8,561,289 B2
(45) Date of Patent: Oct. 22, 2013

(54) REPAIR METHOD AND REPAIR JIG

(75) Inventor: Makoto Hirano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/816,978

(22) Filed: Jun. 16, 2010

(65) Prior Publication Data
US 2010/0251530 A1    Oct. 7, 2010

Related U.S. Application Data

(63) Continuation of application No. PCT/JP2007/074733, filed on Dec. 21, 2007.

(51) Int. Cl.
*B23P 19/00* (2006.01)

(52) U.S. Cl.
USPC ............ 29/764; 29/402.03; 29/426.5; 29/258

(58) Field of Classification Search
USPC .............. 29/898.08, 402.03, 426.5, 764, 239, 29/256, 257, 258
See application file for complete search history.

(56) References Cited

U.S. PATENT DOCUMENTS

| | | | | |
|---|---|---|---|---|
| 2,253,411 A * | 8/1941 | Thompson | ...................... | 29/256 |
| 2,820,285 A * | 1/1958 | Neumeister, Jr. | ................ | 29/258 |
| 3,085,786 A * | 4/1963 | Deuss | ............................ | 254/100 |
| 4,285,123 A * | 8/1981 | Chisholm | ........................ | 29/764 |
| 4,433,477 A * | 2/1984 | Karga et al. | ...................... | 29/764 |
| 4,894,910 A * | 1/1990 | Reimer et al. | .................. | 29/764 |
| 4,920,625 A * | 5/1990 | Smith | ............................. | 29/264 |
| 5,031,312 A * | 7/1991 | Culbertson et al. | ............. | 29/828 |
| 5,329,693 A * | 7/1994 | Smith | ............................. | 29/764 |
| 5,425,169 A * | 6/1995 | Steinman et al. | ............... | 29/758 |
| 5,842,261 A * | 12/1998 | Ortiz | ............................ | 29/426.5 |
| 6,397,457 B1 * | 6/2002 | Wuyts | ............................ | 29/762 |
| 7,661,182 B2 * | 2/2010 | Cantrell | ......................... | 29/264 |
| 2002/0010996 A1 * | 1/2002 | Sarver | ............................ | 29/525 |
| 2004/0052478 A1 | 3/2004 | Minamino et al. | | |
| 2004/0111876 A1 * | 6/2004 | Cheng | ............................ | 29/762 |
| 2005/0274005 A1 * | 12/2005 | Hwang-Jyh | .................... | 29/764 |

FOREIGN PATENT DOCUMENTS

| | | |
|---|---|---|
| JP | 2002-164141 | 6/2002 |
| JP | 2002-353471 | 12/2002 |
| JP | 2004-93617 | 3/2004 |
| JP | 2005-26031 | 1/2005 |

OTHER PUBLICATIONS

International Search Report for Application No. PCT/JP2007/074733; mailed Jan. 22, 2008.

* cited by examiner

*Primary Examiner* — David Bryant
*Assistant Examiner* — Christopher Koehler
(74) *Attorney, Agent, or Firm* — Staas & Halsey LLP

(57) ABSTRACT

A repair method for detaching a part from a board in an electronic device module having at least the board and the part bonded with the board by a press fitting process. A repair use block having a repair use through hole is placed on the part, and a repair use bolt is fastened with a repair use female thread formed in the part, in advance, through the repair use through hole. The repair use bolt head abuts against the top surface of the repair use block, then is further fastened, whereupon the part is pulled up together with the repair use female thread upward above the board. When a repair use female thread cannot be directly formed in the part, a repair use auxiliary part which is to be pulled up integrally with the part, is interposed.

5 Claims, 11 Drawing Sheets

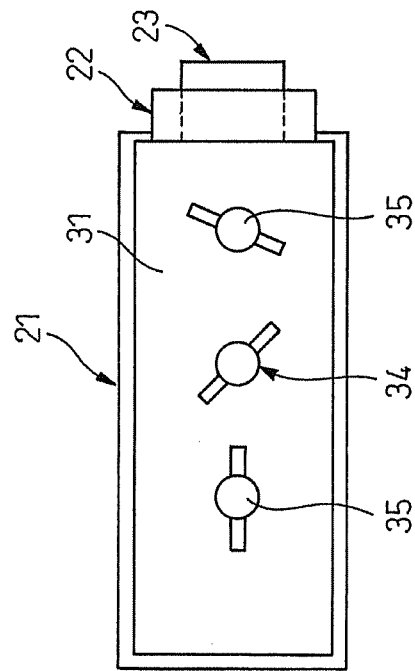
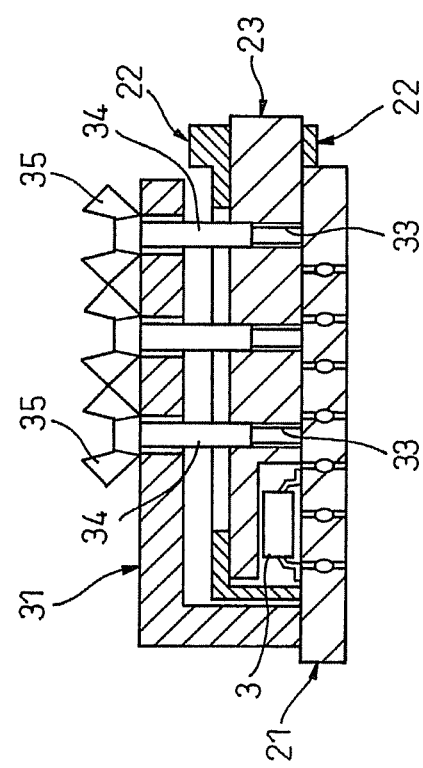

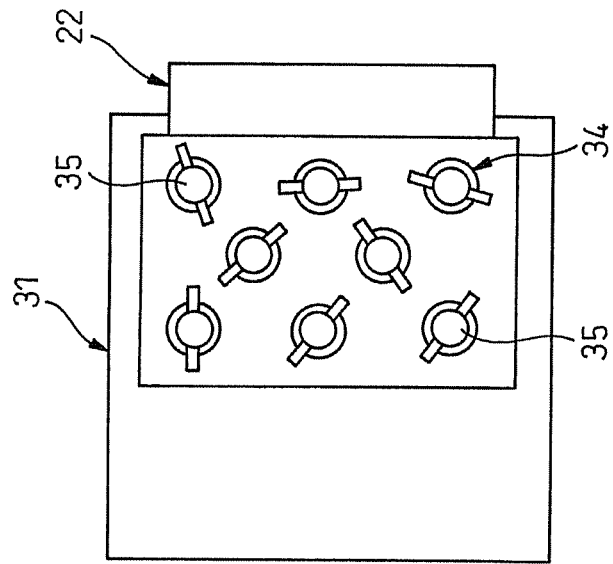

PRESSING FORCE

PRESSING FORCE

REPAIR METHOD AND REPAIR JIG

CROSS-REFERENCE TO RELATED APPLICATIONS

This application is a continuation of International Application PCT/JP2007/074733, filed on Dec. 21, 2007, the contents of which are herein wholly incorporated by reference.

FIELD

The embodiments discussed herein relate to a repair method and a repair jig for detaching a part fixed on a board from the board for replacing the part and so on.

BACKGROUND

In general, an electronic device module is comprised of a board and one or more parts which are placed on the board and fixed to it. As a means of fixing these parts to the board, as in concrete examples which will be explained later, a fixing means of a type press-fitting a plurality of fixing pins provided integrally with the parts into corresponding through holes formed in the board is becoming the mainstream.

This fixing method using press fitting is a method of pushing a fixing pin into a through hole by a press fit connector press fitting device or the like with a considerable pressing force, the fixing pin has an outside shape dimension larger than the diameter of a through hole and partially has a resilient portion. A part can be tightly fixed to a board by a strong bonding force with a relatively simple and easy process.

This embodiment particularly relates to a repair method for detaching a part which is fixed to a board by the press fit process, from the board for repair or replacement of the part. Further, a repair jig for this purpose will be explained. Note that, as a known example relating to the embodiment, there is the following Patent Document 1.

In this Patent Document 1, it is disclosed to fasten a detachment use screw and make the screw itself act upon one of two objects which are engaged, bonded, or press fit with each other to thereby obtain a reaction force in the upward direction and to detach the two objects. For this reason, in a case where the force of engagement, bonding, or press fitting between these two objects is very high, the force by the fastened screw is applied directly to the parts, and thus there may be a possibility that the parts themselves or the board mounting the parts are damaged eventually.

On the other hand, the later explained embodiment is a process of fastening a screw through a detachment use block so as to obtain a force in an upward direction for one of the objects and detach it from the other object which is engaged, bonded, or press fit with the former object. This is different from the technique of the Patent Document 1. Note that, the Patent Document 1 relates to a socket itself and also a method of mounting the socket, which method is different from a process of detachment between two parts or two structures which are engaged, bonded, or press fit with each other as in the embodiment.

Patent Document 1: Japanese Laid-Open Patent Publication No. 2005-26031

FIGS. 8A, 8B, and 8C are views illustrating a side view of a partial cross-section (A), a plan view (B), and a front view of a partial cross-section (C) of an electronic device module, as a first example, to which the embodiment is applied. This first example is a small-sized optical device which can be inserted or removed at the front surface of a communication apparatus. It has been developed as an SFP (Small Form Factor Pluggable) or XFP (10 Gigabit Small Form Factor Pluggable) optical transceiver and has come into wide use in recent years. This small-sized optical device can be replaced with another small-sized optical device having a different function, even after completion of a printed circuit board, and thus various desired functions can be realized on the same board.

In FIG. 8A, notation 1 is the above small-sized optical device. Various electronic circuits are formed in that device. A card connector 2 (see FIG. 8B, however, shown with front end portion 1b, in FIG. 8A, removed) for input/output signals, which is connected to these electronic circuits, is connected to a small-sized optical device engagement connector 3. This connector 3 is mounted on a printed circuit board 4 which is shown by a cross-section in FIG. 8A.

On this printed circuit board 4, the above small-sized optical device 1 can slide to the left and right in FIG. 8A, and thus the connector 2 can be freely attached to and detached from the connector 3. The insertion/removal directions of the small-sized optical device 1, in this case, is shown by the two-way arrows in FIGS. 8A and 8B. In FIG. 8B, the two 1a illustrate front surface portions, the 1a on the left side illustrates the position immediately before the small-sized optical device 1 is inserted into the deep position and immediately before the connector 2 is engaged with the connector 3, and the right side 1a illustrates the position in the middle of removal of the small-sized optical device 1 to the outside. Note that, the front surface portion 1a is shown in FIG. 8C. The small-sized optical device engagement connector 3, explained before, which is located in the deep position is illustrated by a dotted line.

When the small-sized optical device 1 is inserted and removed in the direction of the two-way arrows described above, the device 1 is guided by a cross-sectional box shaped cage 5 (see FIG. 8C). This cage 5 is provided with a plurality of fixing pins 6 at its bottom and is provided with an opening 5a for heat dissipation at its top. These fixing pins 6 are the press fit type pins explained above. These pins 6 have resilient parts 6a formed at parts of the pins 6. These pins 6 are pushed into through holes, formed in the printed circuit board 4, by a strong pushing force and tightly fix the cage 5 onto the printed circuit board 4. Note that, in the embodiments explained later, the "part" corresponds to that cage 5 and the "board" corresponds to that printed circuit board 4.

Incidentally, manufacturers of the above small-sized optical devices 1 are jointly establishing MSA (Multi Source Agreement) standards in which they determine specifications concerning the shapes of the parts 1, the shapes of the cages 5, the shapes of the small-sized optical device engagement connectors 3, and so on. Due to this, these are becoming a multivendor optical devices standard throughout the world.

The cage 5 must be able to withstand the mechanical stress at the time of insertion and removal of the small-sized optical device 1 in the cage 5. Therefore, it is difficult to make the device 1 as an SMD (Surface-Mounted Device). Further, even if making the device 1 as an IMD (insertion mounting device), since reflow of both surfaces of the printed circuit board 4 is becoming common practice, at the present time, this IMD cannot be employed from the point of view of workability. Therefore, the press fit process described above has become the mainstream.

Here, the process of press fitting the fixing pins 6 of the cage 5 into through holes in the printed circuit board 4 will be explained by using the drawings.

FIGS. 9A, 9B, and 9C are views illustrating the situation when fixing pins 6 of the cage 5, shown in FIGS. 8A, 8B, and 8C, are press fit in the through holes of the printed circuit board 4 with a cross-sectional side view (A), a plan view (B), and a cross-sectional front view (C), respectively.

In FIGS. 9A, 9B, and 9C, a press fit head 7 is placed on the cage 5. This head 7 is pressed downward ("pressing force") to press fit the fixing pins 6, provided at the cage 5, into the through holes in the printed circuit board 4. At this time, a crush prevention block 8 is inserted inside the cage 5 in advance so that the cage 5 is not crushed by the press fit head 7. Further, in order to prevent excessive pressing by the press fit head 7, it is shaped such that the head 7 surrounds three sides of the cage 5.

FIGS. 10A, 10B, and 10C are views illustrating a partial cross-sectional side view (A), a plan view (B), and a partial cross-sectional front view (C) of an electronic device module of a second example, respectively, to which the embodiment is applied during a press fitting process.

The electronic device module of this second example is a sheet connector 10 and is provided with a large number of female type connectors 11. In a communication apparatus etc. which is comprised of a sub rack (shelf) structure, a sheet connector 10 is indispensable for connection with male type pins of a back wiring board (BWB) 13 in which a plurality of plug-in units (PIU) are accommodated as cards.

At the bottom of this sheet connector 10 as well, the already explained plurality of fixing pins 6 are provided. By pressing the connector 10 downward by the press fit head 12, resilient parts 6a of the fixing pins 6 are pressed into the through holes of the printed circuit board 4 and fixed.

Incidentally, regarding this sheet connector 10 as well, along with an increase in the ratio of SMD in the plug-in units (PIU), the two-surface reflow method has become the mainstream. For this reason, press fit type fixing pins are becoming the mainstream. This is because, if the IMD method is used, the production efficiency becomes poor since a manual soldering work must be carried out.

As previously explained, the theme of this embodiment resides in a repair method for detaching the cage 5, shown in FIGS. 8A to 8C and FIGS. 9A to 9C, from the printed circuit board 4 or a repair method for detaching the sheet connector 10, shown in FIGS. 10A to 10C, from the printed circuit board 4. Below, conventional examples of these repair methods will be explained.

FIGS. 11A and 11B are views illustrating a conventional example of the repair method by a side view of a partial cross-section (A) and a front view (B). Note that, the figures are shown taking as an example the electronic device units of FIGS. 8A to 8C and FIGS. 9A to 9C, but the principle of this repair method may be applied in the same way to the electronic device unit of FIGS. 10A to 10C, explained before, as well.

The electronic device unit shown in FIGS. 8A to 8C is turned upside down as shown in FIGS. 11A and 11B. Projecting parts 6b, i.e. the front ends of the fixing pins 6 which project from the back surface of the printed circuit board 4 are pressed by a repair use block 14 from above. By this, the entire cage 5 is pushed downward from the fixed board 4 to detach the cage 5 from the board 4. This is the conventional repair method.

In recent years, however, such a repair method according to the conventional art can no longer be applied. This is a problem. The reason for this is that, in FIGS. 11A and 11B, the repair block 14 must push the entire cage 5 (or sheet connector 10) downward from the board 4 through the projecting parts 6b of the fixing pins 6. However, the projecting parts 6b are becoming to disappear due to various requests. This will be explained specifically below.

FIGS. 12A and 12B are views for explaining the problem of the conventional repair method for an electronic device unit (first example) with reference to a side view by the cross-section (A) and front view (B). In recent years, further higher density mounting of the above described SFPs and XFPs has been requested. For this reason, a structure arranging two sets of SFPs etc. so that their two surfaces face each other, was proposed as illustrated. In this way, it has become possible to improve the efficiency of housing SFPs in a communication apparatus.

However, when employing a two-surface facing structure as described above, the projecting parts 6b at the upper side of the cage 5 projecting from the back surface of the board 4 and the projecting parts 6b' at a lower side of the cage 5' projecting from the front surface of the board 4 become obstacles when making the two surfaces abut against each other, so these projecting parts were eliminated. As a result, a new repair method in place of the conventional repair method shown in FIGS. 11A and 11B has become necessary. The same is true for the electronic device module (second example) shown in FIGS. 10A to 10C as well. This will be shown by the drawings.

FIG. 13 is a side view of a partial cross-section for explaining the problem of the conventional repair method for an electronic device unit (second example). In a communication apparatus of a sub rack (shelf) structure explained above, along with the higher densities and higher speeds, the thickness of the board 4 has become greater. In particular, in BWB, as a recent tendency, a board comprised of 40 layers (sheet thickness: 6 mm) or more has appeared. Further, in order to handle high speed signals, noise countermeasures have become necessary.

In this regard, the projecting parts projecting from the back surface of the board 4, that is, the projecting parts 6b of the fixing pins 6 fixing the sheet connector 10, act as antennas and sometimes receive noise N. The noise N is transmitted to the BWB through the sheet connector 10 and ends up being transmitted to the PIU through an inner layer of the board 4, so there is possibility of the noise N causing malfunctions in the signal processing. As a result, the projecting parts 6b are cut away, and thus a new repair method in place of the conventional repair method shown in FIGS. 11A and 11B has become necessary.

SUMMARY

Accordingly, it is an object of one aspect of the invention to provide a new repair method which does not utilize the projecting parts 6b, and thus the new repair method can take the place of the conventional repair method of pushing the projecting parts 6b of a plurality of press fit type fixing pins 6, as a whole, into a board 4 by a repair use block 14 so as to detach parts (cage 5, sheet connector 10) from a board 4. Further, the object is to provide a repair jig for the new repair method.

According to the embodiment, first, a substantially box shaped repair use block is used. The block is covered over a part which is fixed on the board and must be detached. The top surface of this repair use block is provided with a repair use through hole. On the other hand, a repair use female thread is cut in the part at a position facing the repair use through hole.

A repair use bolt on which a male thread is cut is inserted into the repair use female thread through the repair use through hole. The bolt is fastened to this repair use female thread. It is then further fastened so that the head of the repair use bolt abuts against the top surface of the repair use block. When further fastened, the rotation force of the screwing of the repair use bolt becomes a force pulling up the repair use female thread. The part is pulled up from the board together with the female thread whereby the repair of the part is completed.

BRIEF DESCRIPTION OF DRAWINGS

FIGS. 4A and 4B are views illustrating a modification of the structure of FIGS. 3A to 3C, by a side view (A) and a plan view (B).

FIGS. 6A and 6B are views illustrating a modification of the structure of FIG. 5, by a side view (A) and a plan view (B).

DESCRIPTION OF EMBODIMENTS

Figure 1:
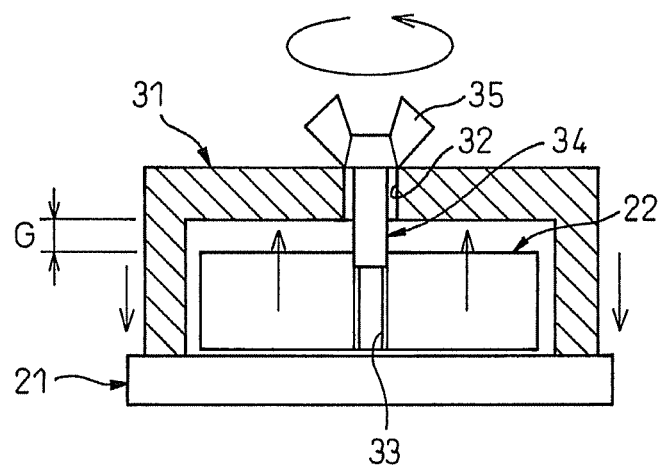
FIG. 1 is a partial cross-sectional view for explaining a repair method according to a first embodiment.

FIG. 1 is a partial cross-sectional view for explaining a repair method according to a first embodiment. The repair method illustrated in the figure is a repair method for detaching a part 22 from a board 21 in an electronic device module, where the board 21 and part 22 fixed to the board 21 are bonded by press fitting a plurality of fixing pins 6 provided integrally with the part 22 into through holes which are formed in the board 21 corresponding to the fixing pins 6 so as to fix the part 22 to the board 21. Note that, the board 21 corresponds to the printed circuit board 4 etc. explained before, and the part 22 corresponds to the cage 5 and sheet connector 10 explained before.

The repair method comprises:

First step: placing a substantially box shaped repair use block 31 on a board 21 so as to cover a part 22, which block 31 is provided with a repair use through hole 32 at its top, Second step: inserting a repair use bolt 34 having a male thread into a repair use female thread 33 through the repair use through hole 32, the female thread 33 is provided in a portion of the part 22 to be detached, the female thread 33 facing the repair use through hole 32, and further fastening the bolt 34 and Third step: making a head 35 of the repair use bolt 34 abut against the top surface of the repair use block 31 by that fastening, then continuing the fastening to pull the part 22 up toward the top surface, to detach the part 22 from the board 21.

Figure 2:
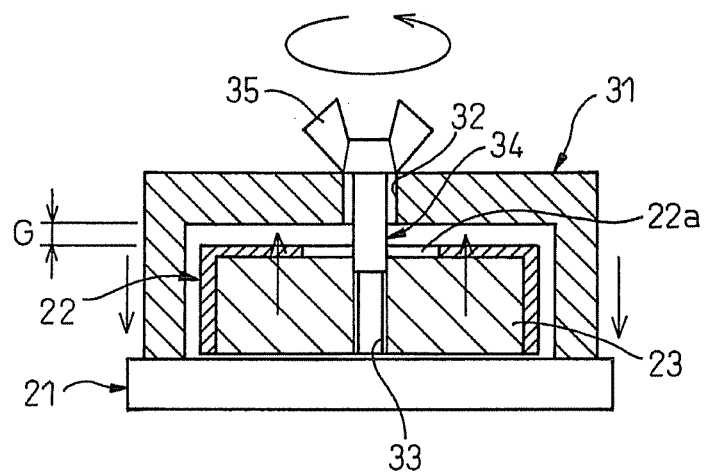
FIG. 2 is a partial cross-sectional view for explaining a repair method according to a second embodiment.

FIG. 2 is a partial cross-sectional view for explaining a repair method according to a second embodiment. The repair method according to this second embodiment is, in the same way as the above first embodiment, a repair method for detaching a part 22 from a board 21 in an electronic device module, where the board 21 and part 22 fixed to the board 21 are bonded by press fitting a plurality of fixing pins 6 provided integrally with the part 22 into through holes which are formed in the board 21 corresponding to the fixing pins 6 so as to fix the part 22 to the board 21, but differs from the above steps in the following second and third steps.

The repair method comprises:

First step: placing a substantially box shaped repair use block 31 on a board 21 so as to cover a part 22, which block 31 is provided with a repair use through hole 32 at its top, Second step: interposing a repair use auxiliary part 23 which can be pulled upward integrally with the part 22 and has a repair use female thread 33 formed in a portion of the part 23, inserting a repair use bolt 34 having a male thread into the female thread 33 through an opening 22a formed in the top surface of the part 22, and further fastening the bolt 34, Third step: making a head 35 of the repair use bolt 34 abut against the top surface of the repair use block 31 by that fastening, then continuing the fastening to pull the part 22 upward toward the top surface integrally with the repair use auxiliary part 23, to detach the part 22 from the board 21.

Figure 9A:
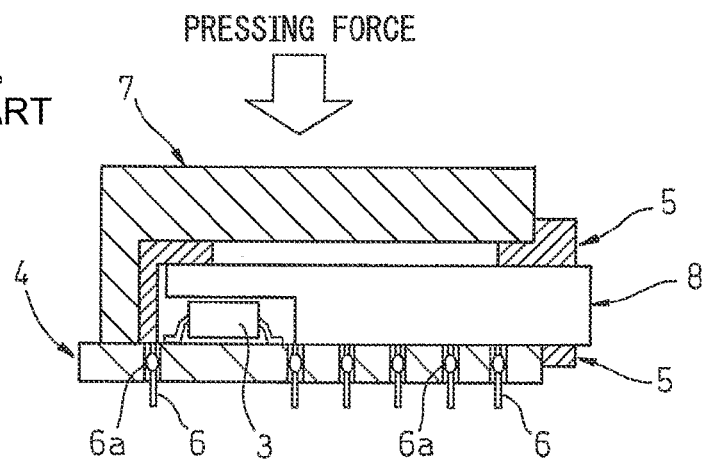
FIGS. 9A, 9B, and 9C are views illustrating a situation of press fitting the cage 5 (FIGS. 8A to 8C) into a board 4, by a side view (A), a plan view (B), and a front view (C).
Figure 9B:
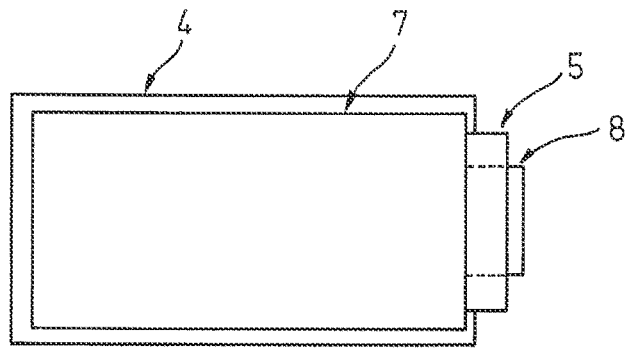
Figure 9C:
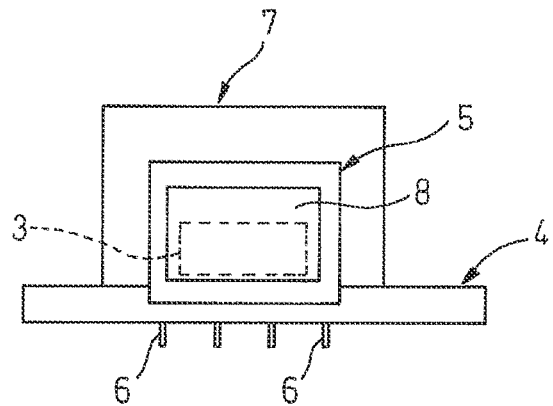
Figure 10A:
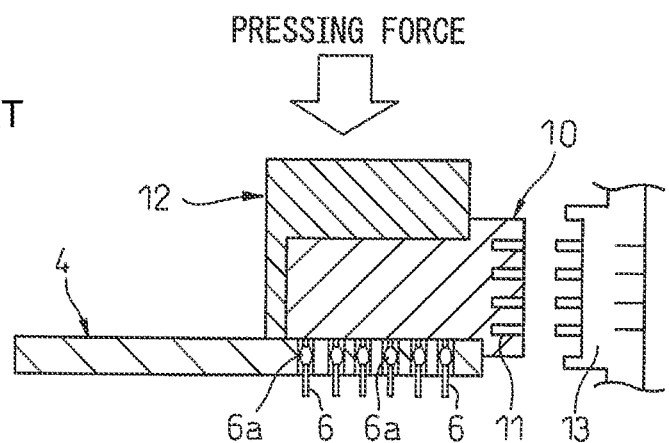
FIGS. 10A, 10B, and 10C are views illustrating a side view (A), a plan view (B), and a front view (C) of an electronic device module of the second example to which the embodiment is applied during a press fitting process.
Figure 10B:
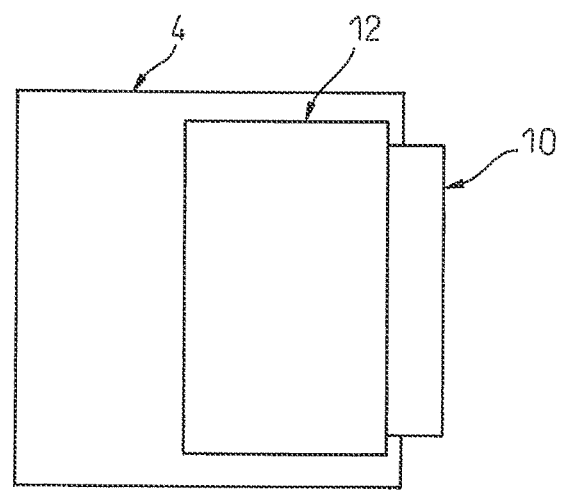
Figure 10C:
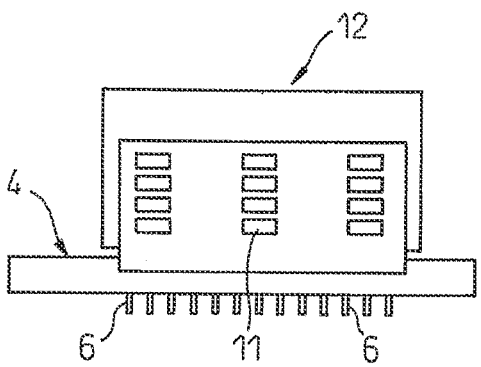
Figure 11A:
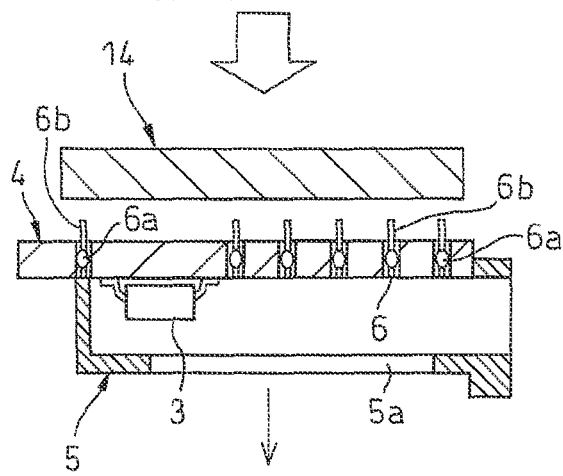
FIGS. 11A and 11B are views illustrating a conventional example of the repair method, by a side view (A) and a plan view (B).
Figure 11B:
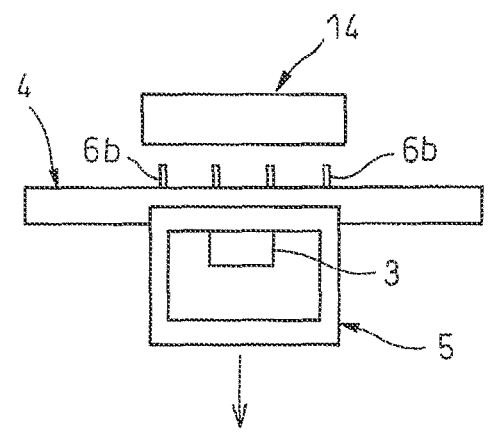

This second embodiment is useful in a case where the repair use female thread 33 cannot be directly formed in the part 22 (see FIGS. 9A to 9C). On the other hand, the first embodiment can be employed in a case where the repair use female thread 33 can be directly formed in the part 22 (FIGS. 10A to 10C). Note, even in this latter case, the second embodiment may be employed as well (see FIGS. 7A to 7C which will be explained later). Next, concrete examples will be shown.

In this way, after the head 35 of the repair use bolt 34 abuts against the top surface of the repair use block 31, the part 22 (part 23) is pulled upward in the block 31, therefore it is necessary to provide a predetermined gap G corresponding to a pull up stroke when pulling up the part 22 between the repair use block 31 and the part 22. This stroke may be a stroke of an extent, for example, by which the resilient parts 6a of the fixing pins 6 are pulled out from the through holes of the board 4 in which they were press fit.

According to this embodiment, the rotation force obtained by screwing is converted to a strong force pulling a part above the board. Due to this force, the part is pulled up from the board.

Figure 12A:
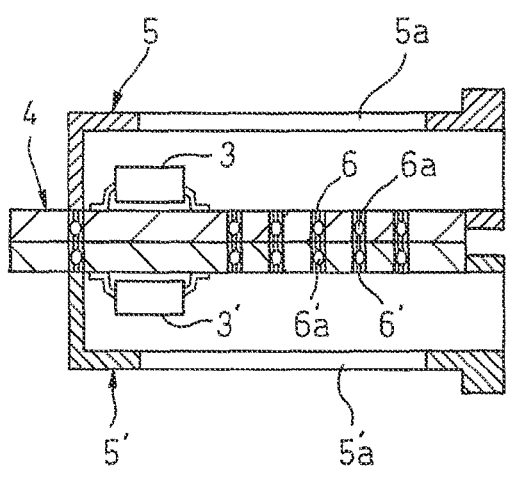
FIGS. 12A and 12B are views for explaining the problem in a conventional repair method of an electronic device unit (first example), by a side view (A) and a plan view (B).
Figure 12B:
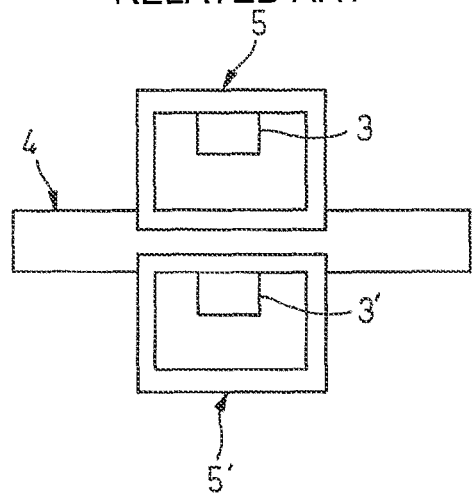
Figure 13:
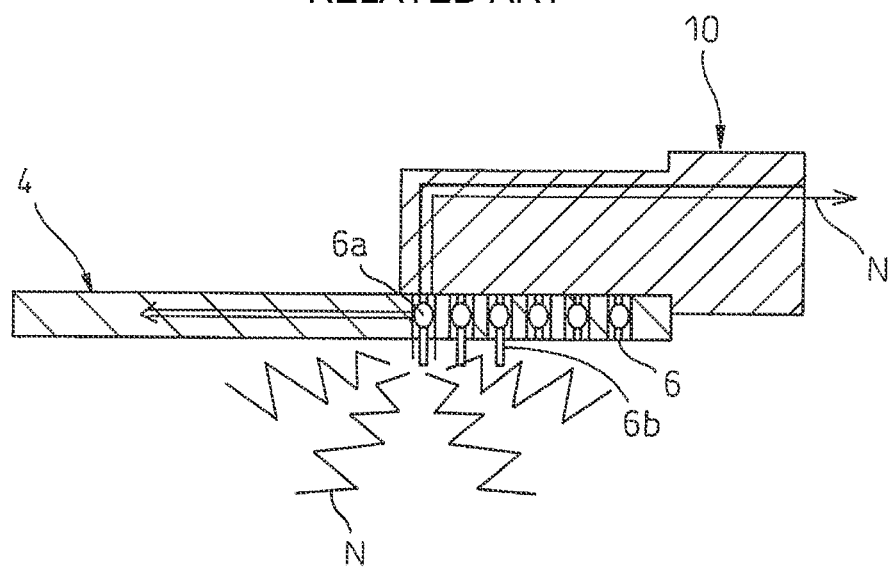
FIG. 13 is a side view for explaining the problem in a conventional repair method of an electronic device unit (second example).

For this reason, as shown in FIGS. 12A and 12B and FIG. 13, even when the projecting parts 6b of the fixing pins 6 of the parts (5, 10) are cut off, repair becomes possible. Further, the force obtained by screwing is utilized, therefore a large upward pulling force is obtained by a very small screwing force.

Figure 3A:
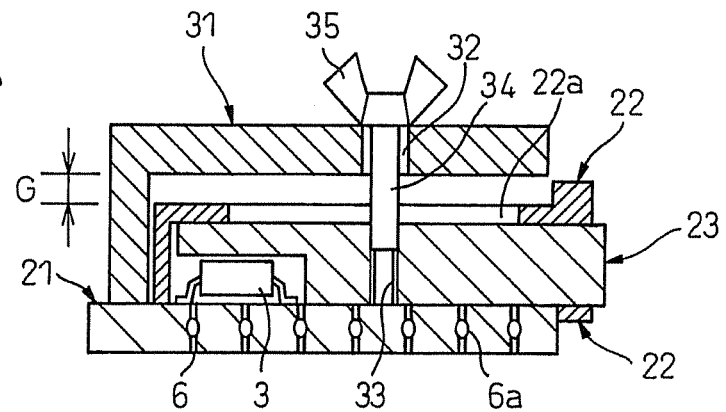
FIGS. 3A, 3B, and 3C are views illustrating a first concrete example of the method according to the embodiment, by a side view (A), a plan view (B), and a front view (C).
Figure 3B:
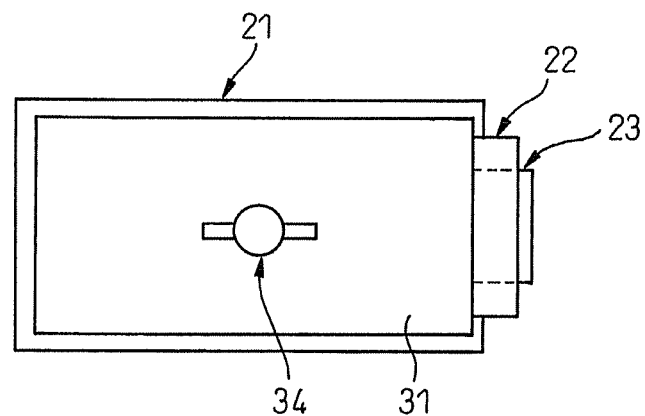
Figure 3C:
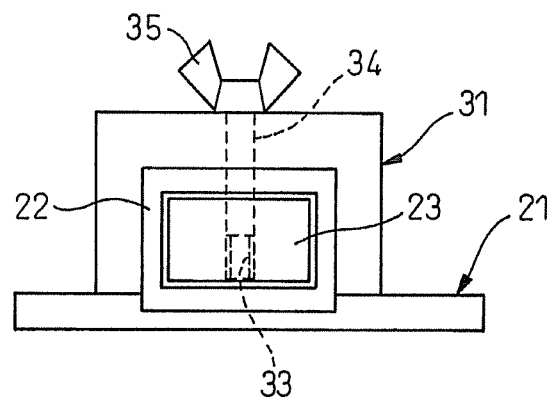

FIGS. 3A, 3B, and 3C are views illustrating a first concrete example of the method according to the embodiment by a side view of a partial cross-section (A), a plan view (B), and a front view of a partial cross-section (C). Note, this is based on the second embodiment.

In FIG. 3A, the part 22 (for example cage 5) is fixed onto the board 21 by fixing pins 6. When detaching the part 22 from the board 21, first, a repair use auxiliary part 23 (not shown as a cross-section) is inserted inside the part 22. A repair use female thread 33 is formed in part of the auxiliary part 23.

Next, the repair use block 31 is placed on the board 21 in a manner covering the part 22. Further, the repair use bolt 34 is inserted through the repair use through hole 32 provided in the repair use block 31 and through an opening 22a, already provided in the part 22 (cage 5), into the female thread 33 and fastened. When this fastening further proceeds and the head 35 abuts against the top surface of the block 31, the rotation force of the bolt 34 becomes a force pulling up the part 23. The part 23 pulls up integrally with the part 22 in the gap G. Finally, the part 22 is detached from the board 21 to complete the repair.

The repair use auxiliary part 23 in the second embodiment desirably is shaped so that the part 22 is pushed upward from its back surface.

In the repair method illustrated in FIGS. 3A to 3C, alignment of the through hole 32, female thread 33, and opening 22a for inserting the bolt 34 in a straight line would seem to be difficult. Assuming here that the opening 22a is a sufficiently large opening, first, the position of the through hole 32 is fixed at a certain point by making the block 31 abut against the side wall of the part 22. Further, the position of the female thread 33 is fixed at a certain point by the abutment against the side wall of the part 22. Therefore, the alignment described above can be carried out easily and correctly.

Note that, when the part 22 is the cage 5 which guides the SFP/XFP optical transceiver, it is convenient to use the crush prevention block 8 (see FIGS. 9A to 9C) as the repair use auxiliary part 23 by forming the repair use female thread 33 in the block 8 which is used when press fitting the plurality of fixing pins 6, provided integrally with the cage 5, into the corresponding through holes of the board 21.

In FIGS. 3A-3C described above, a case of one repair use bolt 34 was shown. However, one bolt 34 may be unsatisfactory depending on the number of fixing pins 6 or the shape thereof. Therefore, another configuration as shown in FIGS. 4A and 4B is possible.

FIGS. 4A and 4B are views illustrating a modification of the structure of FIGS. 3A-3C by a side view of a partial cross-section (A) and a plan view (B). The figures illustrate a case where three sets of repair use bolts 34 and repair use female threads 33 are provided to raise the pullup force of the part 22.

More specifically, when there is one repair use bolt 34 (FIGS. 3A to 3C), the repair use through hole 32 and repair use female thread 33 are arranged matching with substantially the center of gravity position of the repair use auxiliary part 23. Further, when there are a plurality of repair use bolts 34 (FIGS. 4A, 4B), the repair use through holes 32 and repair use female threads 33 are arranged positioned so that the repair use auxiliary part 23 can be pulled up balanced.

Figure 5:
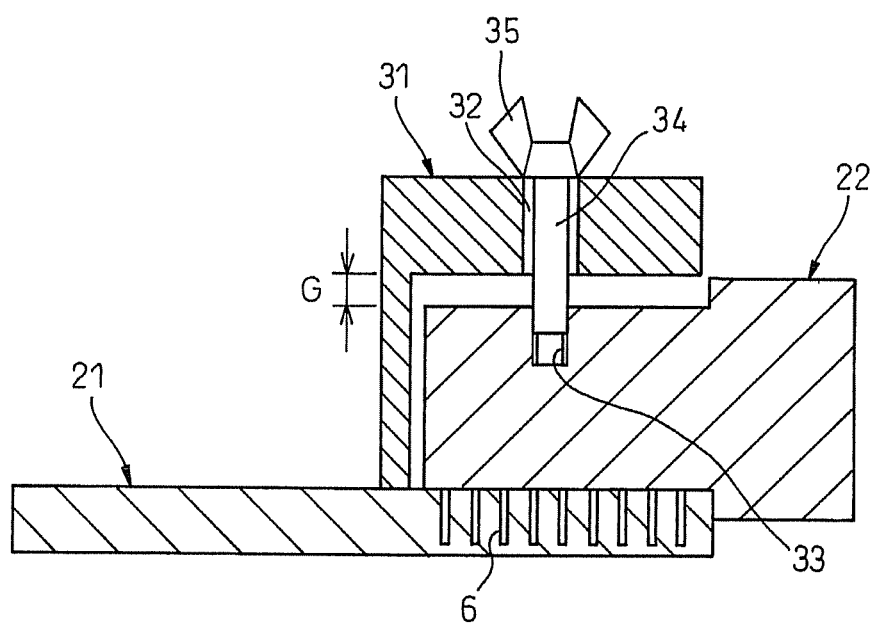
FIG. 5 is a side view illustrating a second concrete example of the method according to the embodiment.

FIG. 5 is a side view of a partial cross-section illustrating a second concrete example of a method according to the embodiment. Note, this is based on the first embodiment. In this figure, the part 22 (for example sheet connector 10) is fixed onto the board 21 by fixing pins 6.

First, the repair use block 31 is placed on the board 21 in a manner covering the part 22. Further, the repair use bolt 34 is inserted into the repair use female thread 33 through the repair use through hole 32 which is provided in the repair use block 31. Note that, this repair use female thread 33 may be formed in advance at the time of manufacture of the part 22 or may be formed when covering the repair use block 31 at the time of repair.

The above repair use bolt 34 is fastened with the repair use female thread 33. After the head 35 abuts against the top surface of the block 31, the bolt 34 is further fastened. As a result, the part 22 is pulled up in the gap G above the board 21, and the fixing pins 6 are pulled outside the board 21, whereupon the repair is completed.

At the time of formation of the repair use female thread 33, if the thread 33 is cut through the through hole 32 in a state where the repair use block 31 is pushed against the side wall of the part 22, the alignment of the repair use through hole 32 and screw 33, at the time of repair, is easy.

FIGS. 6A and 6B are views illustrating a modification of the structure of FIG. 5. In the figures, three sets of repair use bolts 34 and repair use female threads 33 are provided to raise the pulling up force of the part 22.

More specifically, when there is one repair use bolt 34 (FIG. 5), the repair use through hole 32 and repair use female thread 33 are arranged matching with substantially the center of gravity position of the part. When there are a plurality of repair use bolts 34, the repair use through holes 32 and repair use female threads 33 are arranged such that the part 22 can be pulled up balanced.

Figure 7A:
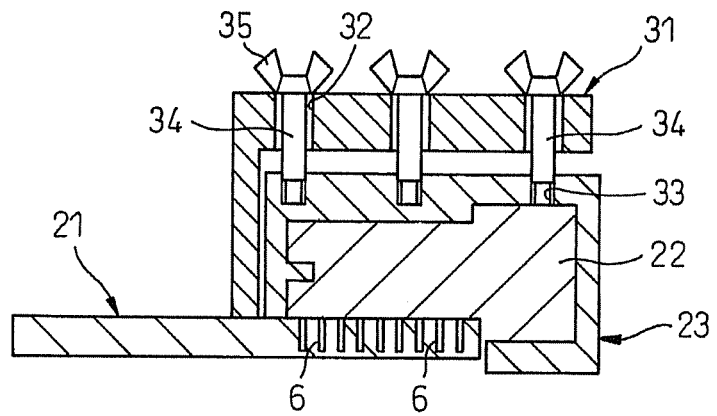
FIGS. 7A, 7B, and 7C are views illustrating a third concrete example of a method according to the embodiment, by a side view (A), a plan view (B), and a front view (C).
Figure 7B:
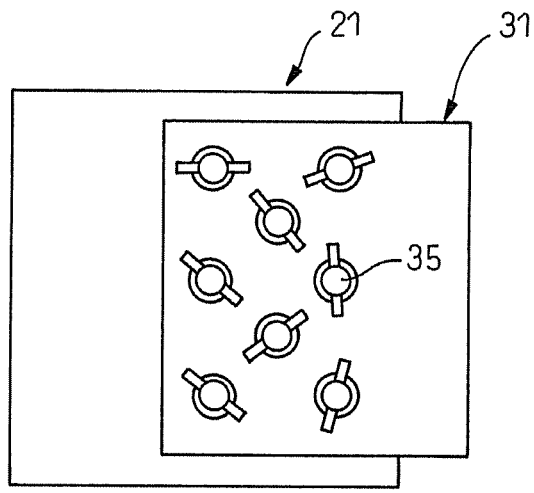
Figure 7C:
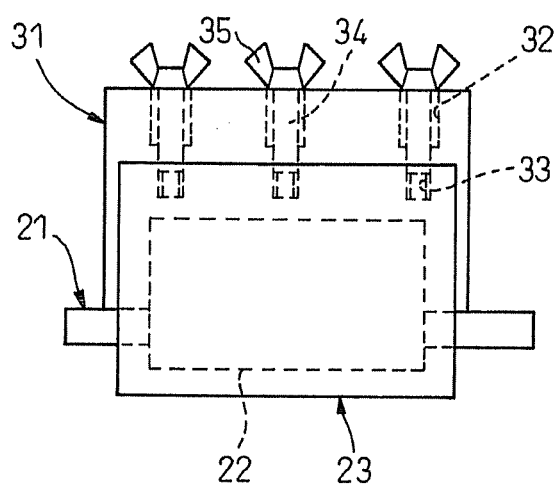
Figure 8A:
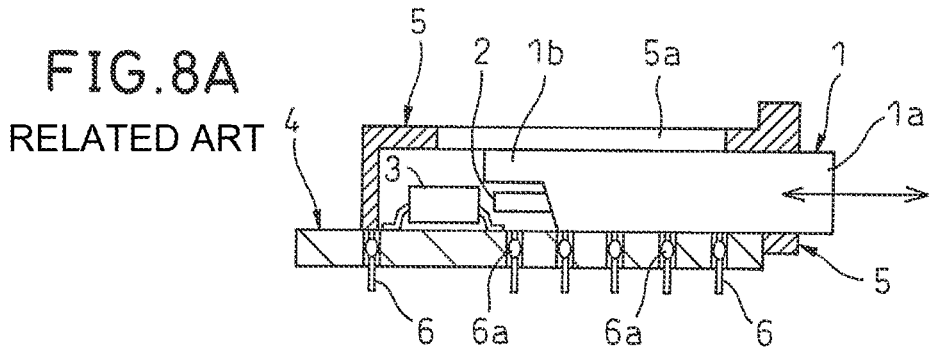
FIGS. 8A, 8B, and 8C are views illustrating an electronic device module of a first example to which the embodiment is applied, by a side view (A), a plan view (B), and a front view (C).
Figure 8B:
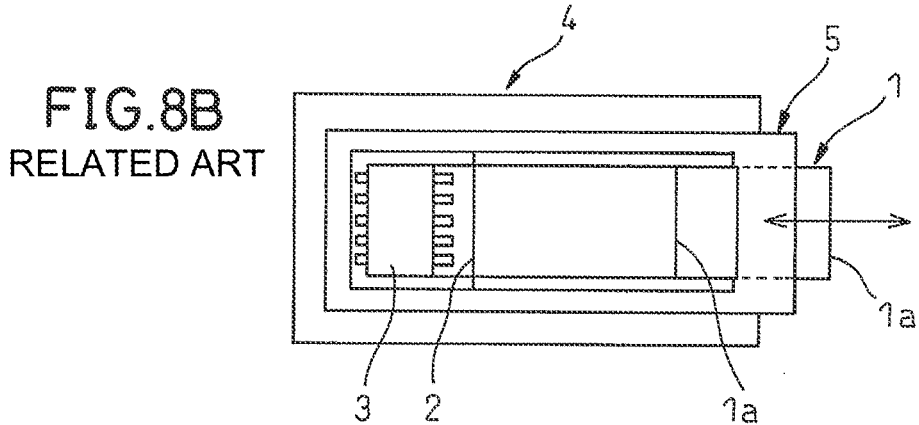
Figure 8C:
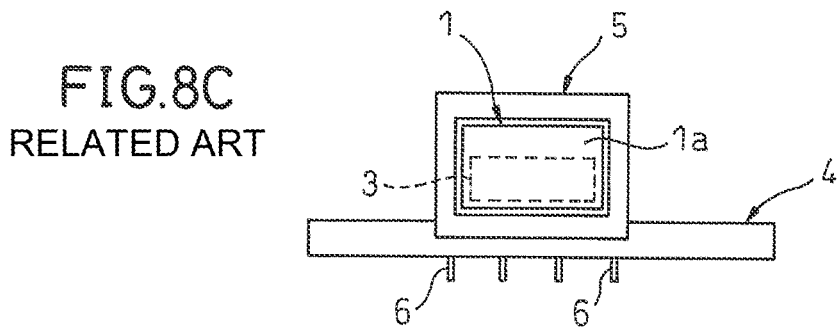

FIGS. 7A, 7B, and 7C are views illustrating a third concrete example of the method according to the embodiment, by a side view of a partial cross-section (A), a plan view (B), and a front view of a partial cross-section (C). Even in a case where the repair use female thread 33 can be directly formed in the part 22 (see FIGS. 6A and 6B), the repair use auxiliary part 23 may be used together as well, if necessary. FIGS. 7A to 7C illustrate the example of using the auxiliary part 23 together in this way. In this case, the repair use auxiliary part 23 preferably has a shape so that the part 22 is held from side surfaces thereof as shown in FIGS. 7A and 7C. Note that, FIGS. 7A to 7C illustrate a plurality of sets of bolts 34 and female threads 33 (eight sets in the figure), but only one set need be provided depending on the pullup force of the bolt 34.

A detailed explanation was given above of the repair method according to the embodiments. If focusing on the repair jigs of the embodiments, they are as follows. Namely, a repair jig proposed according to the embodiment is, for example, as shown in FIG. 1, a repair jig for detaching a part 22 from a board 21 in an electronic device module, where the board 21 and the part 22 are bonded by press fitting a plurality of fixing pins 6 which are provided integrally with the part 22 into through holes formed in the board 21 corresponding to the fixing pins 6, so as to fix the part 22 to the board 21. This repair jig is comprised of (i) a substantially box shaped repair use block 31 which has a repair use through hole 32 formed in its top surface and is placed on the board 21 so as to cover the part 22 and (ii) a repair use bolt 34 having a male thread cut in its outer periphery and inserted, through a repair use through hole 32, into a repair use female thread 33 which faces the through hole 32 and is provided in a part of the part 22 to be detached, and further fastened.

Note that, in the repair jig described above, when there is one repair use bolt 34, the repair use through hole 32 and repair use female thread 33 are arranged matching with substantially the center of gravity position of the part 22. When there are a plurality of repair use bolts 34, the repair use through holes 32 and repair use female threads 33 are arranged such that the part 22 can be pulled up balanced.

A repair jig of one another embodiment is, for example, as shown in FIG. 2, a repair jig for detaching a part 22 from a board 21 in an electronic device module, where the board 21 and the part 22 are bonded by press fitting a plurality of fixing pins 6 which are provided integrally with the part 22 into through holes formed in the board 21 corresponding to the fixing pins 6, so as to fix the part 22 to the board 21. It is comprised of (i) a substantially box shaped repair use block 31 which has a repair use through hole 32 formed in its top surface and is placed on the board 21 so as to cover the part 22, (ii) a repair use auxiliary part 23 which can be pulled up integrally with the part 22 to be detached and has a repair use female thread 33 formed in part of it, and (iii) a repair use bolt 34 inserted into the repair use female thread 33 which is provided in a part of the part 22 to be detached and faces the repair use through hole 32 through the repair use through hole 32 and an opening 22a formed in the top surface of the part 22 and further fastened.

In this case, the repair use auxiliary part 23 is shaped to push the part 22 upward from the back surface thereof. This repair use auxiliary part may be shaped so that the part 22 is held from the side surfaces.

Further, in this case, when there is one repair use bolt 34, the repair use through hole 32 and repair use female thread 33 are arranged matching with substantially the center of gravity position of the repair use auxiliary part 23. When there are a plurality of repair use bolts 34, the pairs of repair use through holes 32 and repair use female threads 33 are arranged such that the repair use auxiliary part 23 can be pulled up balanced.

Note that, as one concrete example, when the part 22 explained before is the cage 5 which guides the SFP/XFP optical transceiver, the repair use auxiliary part 23 is configured to form the repair use female thread 33 in the crush prevention block 8 used when press fitting a plurality of fixing pins 6, provided integrally with the cage 5, into the corresponding through holes of the board 21.

Explanation of Notations
1 small-sized optical device
2 card connector
3 small-sized optical device engagement connector
4 printed circuit board (board)
5 cage (part)
5a opening
6 fixing pin
6a resilient part
8 crush prevention block
10 sheet connector
11 female type connector
21 board
22 part
22a opening
23 repair use auxiliary part
31 repair use block
32 repair use through hole
33 repair use female thread
34 repair use bolt
35 head

What is claimed is:

1. A repair jig for detaching a cage from a printed circuit board in an electronic device module, comprising:
    a substantially box shaped repair use block which has a repair use through hole in its top surface and is placed on the printed circuit board so as to cover the cage which accommodates electronic parts movably therein and is provided with a plurality of press-fitting type fixing pins integrally therewith as one body, each having a resilient member fixed thereto, integrally with the press-fitting type fixing pins being bonded with the printed circuit board by the respective resilient member by press fitting the press-fitting type fixing pins into through holes formed in the printed circuit board corresponding to respective press-fitting type fixing pins,
    a repair use auxiliary part which can be pulled up integrally with the cage to be detached and has a repair use female thread which is formed in a portion thereof and penetrates from the top surface of the repair use auxiliary part to the bottom surface thereof, forming an opening at the bottom surface of the repair use auxiliary part, which bottom surface with the opening contacts the upper surface of the printed circuit board, and
    a repair use bolt to be inserted into the repair use female thread and fastened with the repair use female thread through the repair use through hole and an opening formed in the top surface of the cage.

2. The repair jig according to claim 1, wherein the repair use auxiliary part is shaped so that the cage is pushed upward from its back surface.

3. The repair jig according to claim 1, wherein the repair use auxiliary part is shaped so that the cage holds the repair use auxiliary part from the side surfaces.

4. The repair jig according to claim 1, wherein when there is one repair use bolt, the repair use through hole and the repair use female thread are arranged matching with substantially the center of gravity position of the repair use auxiliary part, and when there are a plurality of repair use bolts, the repair use through holes and the repair use female threads are arranged such that the repair use auxiliary part can be pulled up balanced.

5. The repair jig according to claim 1, wherein when the cage is a guide of an SFP/XFP optical transceiver, the repair use auxiliary part is configured to form the repair use female thread in a crush prevention block which is used when press fitting the plurality of press-fitting type fixing pins, provided integrally with the cage, into the corresponding through holes of the printed circuit board.

* * * * *